United States Patent
Huang et al.

(10) Patent No.: US 11,728,161 B2
(45) Date of Patent: Aug. 15, 2023

(54) SPIN ON CARBON COMPOSITION AND METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: Jing Hong Huang, Kaohsiung (TW); Ching-Yu Chang, Yuansun Village (TW); Wei-Han Lai, New Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/864,293

(22) Filed: Jul. 13, 2022

(65) Prior Publication Data
US 2022/0367178 A1    Nov. 17, 2022

Related U.S. Application Data

(62) Division of application No. 16/984,070, filed on Aug. 3, 2020, now Pat. No. 11,476,108.

(51) Int. Cl.
*H01L 21/02*    (2006.01)

(52) U.S. Cl.
CPC .. *H01L 21/02167* (2013.01); *H01L 21/02115* (2013.01)

(58) Field of Classification Search
CPC .............. H01L 21/02167; H01L 21/02115
See application file for complete search history.

(56) References Cited

U.S. PATENT DOCUMENTS

| | | | | |
|---|---|---|---|---|
| 9,671,694 B1* | 6/2017 | Glodde | ............... | G03F 7/2008 |
| 2003/0017635 A1* | 1/2003 | Apen | ............... | H01L 21/3121 |
| | | | | 257/E21.26 |

(Continued)

FOREIGN PATENT DOCUMENTS

| TW | 201705214 A | 2/2017 |
|---|---|---|
| TW | 201723106 A | 7/2017 |
| TW | 201835258 A | 10/2018 |

OTHER PUBLICATIONS

Non-Final Office Action issued in U.S. Appl. No. 16/984,070, dated Dec. 23, 2021.

(Continued)

*Primary Examiner* — Monica D Harrison
*Assistant Examiner* — Andre C Stevenson
(74) *Attorney, Agent, or Firm* — McDermott Will & Emery LLP

(57) ABSTRACT

A spin on carbon composition, comprises: a carbon backbone polymer; a first crosslinker; and a second crosslinker. The first crosslinker reacts with the carbon backbone polymer to partially crosslink the carbon backbone polymer at a first temperature, and the second crosslinker reacts with the carbon backbone polymer to further crosslink the carbon backbone polymer at a second temperature higher than the first temperature. The first crosslinker is a monomer, oligomer, or polymer. The second crosslinker is a monomer, oligomer, or polymer. The first and second crosslinkers are different from each other. When either of the first crosslinker or the second crosslinker is a polymer, the polymer is a different polymer than the carbon backbone polymer.

20 Claims, 9 Drawing Sheets

(56) References Cited

U.S. PATENT DOCUMENTS

2009/0280435 A1\* 11/2009 McKenzie .............. G03F 7/091
                                                        430/285.1
2012/0097194 A1    4/2012 McDaniel et al.
2021/0163731 A1    6/2021 Kohl et al.

OTHER PUBLICATIONS

Notice of Allowance issued in U.S. Appl. No. 16/984,070, dated Jun. 13, 2022.

\* cited by examiner

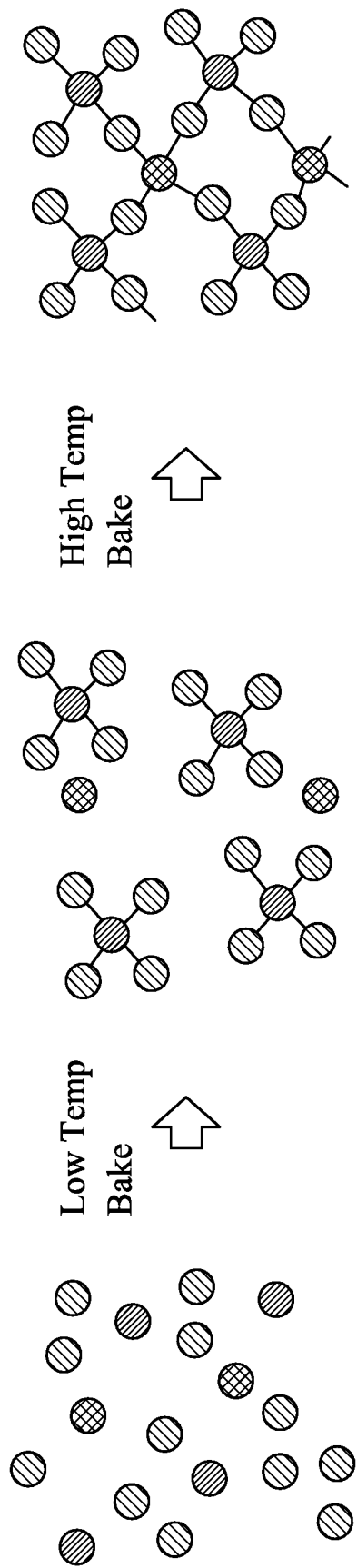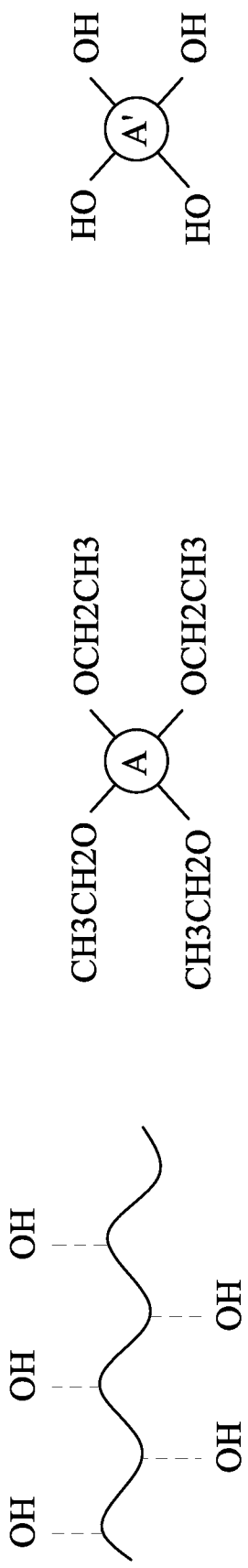
FIG. 9

SPIN ON CARBON COMPOSITION AND METHOD OF MANUFACTURING A SEMICONDUCTOR DEVICE

CROSS-REFERENCE TO RELATED APPLICATION

This application is a Divisional Application of U.S. application Ser. No. 16/984,070, filed Aug. 3, 2020, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example, advanced lithography patterning technologies are implemented to form various patterns, such as gate electrodes and metal lines, on semiconductor wafers. Lithography patterning technologies include coating a resist material on an underlayer disposed over the surface of a semiconductor wafer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 9 illustrates an example of the crosslinking operations according to embodiments of the disclosure.

DETAILED DESCRIPTION

Figure 1:
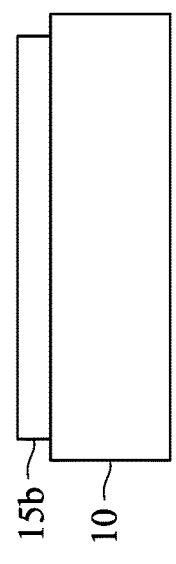
FIG. 1 is a cross sectional view of a sequential operation for manufacturing a semiconductor device according to an embodiment of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Spin on carbon (SOC) materials are used as anti-reflective layers, to planarize uneven topography, or as a bottom layer of a trilayer photoresist in semiconductor manufacturing methods. The SOC materials are coated over a substrate and then may undergo a crosslinking operation between a polymer and a crosslinker in some embodiments. The crosslinking operation may be a thermal crosslinking operation. The SOC layer is heated to initiate the thermal crosslinking operation. However, the heating may cause the SOC layer to reflow and lead to insufficient or uneven coverage of the underlying substrate or topographic features on the surface of the substrate. The insufficient or uneven coverage may lead to damage to the substrate or features on the substrate during subsequent processing operations, such as etching.

Embodiments of the disclosure include a novel SOC composition and method to inhibit SOC layer reflow during the thermal crosslinking operation. Embodiments of the disclosure include a two step heating operation to thermally crosslink the SOC layer. In the first step, the SOC layer is heated at a first temperature to trigger a first crosslinker in the SOC composition to partially crosslink a polymer in the SOC layer. The partial crosslinking reduces the reflow of the SOC layer. The first heating is followed by a second heating at a second temperature higher than the first temperature to trigger a second crosslinker to further crosslink the SOC layer. Because the SOC layer was partially crosslinked in the first heating operation, reflow of the SOC layer is reduced during the second, higher temperature crosslinking operation. The second crosslinking operation fully crosslinks the SOC layer in some embodiments.

FIGS. 1-8 are cross sectional views of sequential operations for manufacturing a semiconductor device according to an embodiment of the disclosure. FIG. 1 shows a SOC layer 15 formed over a substrate 10, such as a wafer. In some embodiments, the SOC layer 15 is deposited as a liquid mixture and the substrate 10 is rotated while the SOC layer is deposited over the substrate 10. In some embodiments, the substrate 10 includes wiring patterns, transistors or any other topographic features.

In some embodiments, the substrate 10 includes a single crystalline semiconductor layer on at least its surface portion. The substrate may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate is a silicon layer of an SOI (silicon-on insulator) substrate. In certain embodiments, the substrate is made of crystalline Si. In certain embodiments, the substrate is a silicon wafer.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate. The germanium concentration of the SiGe buffer layers may increase from 30 atomic % for the bottom-most buffer layer to 70 atomic % for the top-most buffer layer.

In some embodiments, the substrate includes at least one metal, metal alloy, and metal/nitride/sulfide/oxide/silicide having the formula $MX_a$, where M is a metal and X is N, S, Se, O, Si, and a is from about 0.4 to about 2.5. In some embodiments, the substrate includes titanium, aluminum, cobalt, ruthenium, titanium nitride, tungsten nitride, tantalum nitride, and combinations thereof.

In some embodiments, the substrate 10 includes a dielectric layer having at least silicon, metal oxide, and metal nitride of the formula $MX_b$, where M is a metal or Si, X is N or O, and b ranges from about 0.4 to about 2.5. Ti, Al, Hf, Zr, and La are suitable metals, M, in some embodiments. In some embodiments, the substrate includes silicon dioxide, silicon nitride, aluminum oxide, hafnium oxide, lanthanum oxide, and combinations thereof.

In some embodiments, the SOC layer 15 includes a SOC composition including a carbon backbone polymer, a first crosslinker, and a second crosslinker.

In some embodiments, the first crosslinker is one or more selected from the group consisting of $A\text{-}(OR)_x$, $A\text{-}(NR)_x$,

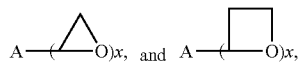

where A is a monomer, oligomer, or a second polymer having a molecular weight ranging from about 100 to about 20,000; R is an alkyl group, cycloalkyl group, cycloalkylepoxy group, or C3-C15 heterocyclic group; OR is an alkyloxy group, cycloalkyloxy group, carbonate group, alkylcarbonate group, alkyl carboxylate group, tosylate group, or mesylate group; NR is an alkylamide group or an alkylamino group; and x ranges from 2 to about 1000. In some embodiments, the molecular weight of the oligomer or second polymer is weight average molecular weight. In some embodiments, R is $(CH_2)_y CH_3$, where $0 \leq y \leq 14$. In some embodiments, OR is $(-O(CH_2CH_2O)_a-CH_2CH_3)$, where $1 \leq a \leq 6$. In some embodiments, R, OR, and NR include a chain structure, a ring structure, or a 3-D structure. In some embodiments, the 3-D structure is selected from the group consisting of norbornyl, adamantyl, basketanyl, twistanyl, cubanyl, and dodecahedranyl groups.

In some embodiments, the second crosslinker is one or more selected from the group consisting of $A\text{-}(OH)_x$, $A\text{-}(OR')_x$, $A\text{-}(C=C)_x$, and $A\text{-}(C\equiv C)_x$, where A is a monomer, oligomer, or a second polymer having a molecular weight ranging from 100 to 20,000; R' is an alkyloxy group, an alkenyl group, or an alkynyl group; and x ranges from 2 to about 1000. In some embodiments, R is $(CH_2)_y CH_3$, where $0 \leq y \leq 14$. In some embodiments, R and OR include a chain structure, a ring structure, or a 3-D structure. In some embodiments, the 3-D structure is selected from the group consisting of norbornyl, adamantyl, basketanyl, twistanyl, cubanyl, and dodecahedranyl groups.

In some embodiments, the carbon backbone polymer contains crosslinking sites on the polymer. In some embodiments, the carbon backbone polymer is a polyhydroxystyrene, polyacrylate, or polymethylmethacrylate.

In some embodiments, a concentration of the first and second crosslinkers ranges from about 20 wt. % to about 50 wt. % of the total weight of the first and second crosslinkers and the carbon backbone polymer. In some embodiments, less than about 20 wt. % of the crosslinkers results in insufficient crosslinking. In some embodiments, more than about 50 wt. % of the crosslinkers provides no or only negligible improvement in the crosslinking. In some embodiments, the concentration of the first crosslinker ranges from about 5 wt. % to about 40 wt. % of the total weight of the first and second crosslinkers and the carbon backbone polymer. In some embodiments, the concentration of the second crosslinker ranges from about 5 wt. % to about 40 wt. % of the total weight of the first and second crosslinkers and the carbon backbone polymer. In some embodiments, the concentration of the first crosslinker is about the same as the concentration of the second crosslinker.

In some embodiments, the spin on carbon composition includes a solvent. In some embodiments, the solvent is chosen such that the polymers and crosslinkers can be evenly dissolved into the solvent and dispensed upon the substrate.

In some embodiments, the solvent is an organic solvent, and includes one or more of any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the SOC composition include, acetone, methanol, ethanol, propanol, isopropanol (IPA), n-butanol, toluene, xylene, 4-hydroxy-4-methyl-2-pentatone, tetrahydrofuran (THF), methyl ethyl ketone, cyclohexanone (CHN), methyl isoamyl ketone, 2-heptanone (MAK), ethylene glycol, 1-ethoxy-2-propanol, methyl isobutyl carbinol (MIBC), ethylene glycol monoacetate, ethylene glycol dimethyl ether, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, n-butyl acetate (nBA), methyl lactate, ethyl lactate (EL), propyl lactate, butyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl 3-ethoxypropionate, methyl 3-methoxypropionate, methyl 3-ethoxypropionate, and ethyl 3-methoxypropionate, β-propiolactone, β-butyrolactone, γ-butyrolactone (GBL), α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether, methyl propionate, ethyl propionate, ethyl ethoxy propionate, methylethyl ketone, cyclohexanone, 2-heptanone, cyclopentanone, cyclohexanone, ethyl 3-ethoxypropionate, propylene glycol methyl ether acetate (PGMEA), methylene cellosolve, 2-ethoxyethanol, N-methylformamide, N,N-dimethylformamide (DMF), N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like.

As one of ordinary skill in the art will recognize, the materials listed and described above as examples of materials that may be used for the solvent component of the SOC composition are merely illustrative and are not intended to limit the embodiments. Rather, any suitable materials that dissolve the carbon backbone polymers and the crosslinkers may be used to help mix and apply the SOC layer. All such materials are fully intended to be included within the scope of the embodiments.

In some embodiments, the SOC layer 15 is formed to a thickness ranging from about 200 nm to about 2,000 nm. In some embodiments, the thickness of SOC layer 15 ranges from about 400 nm to about 1,500 nm, and in other embodiments, the thickness of the SOC layer 15 ranges from about 500 nm to about 1,200 nm depending on the underlying structures (topology), design requirements, and/or process requirements.

Figure 2:
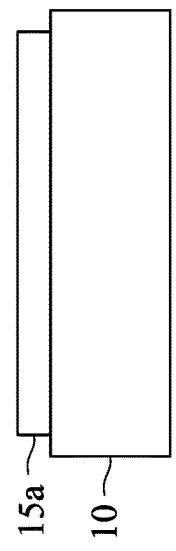
FIG. 2 is a cross sectional view of a sequential operation for manufacturing a semiconductor device according to an embodiment of the disclosure.

The SOC layer 15 is subjected to a first heating at a temperature ranging from about 100° C. to about 170° C. in some embodiments to form a partially crosslinked SOC layer 15a, as shown in FIG. 2. In some embodiments, the first heating is at a temperature ranging from about 100° C. to about 150° C.

The viscosity of the SOC composition is selected so that it provides a target thickness when it is spin-coated on the substrate. In some embodiments, the SOC composition has a viscosity of between about 0.1 to about $1 \times 10^6$ Pa·s at about 20° C. and is spin coated on the substrate at about 1500 rpm. The first heating at about 100° C. to about 170° C. causes partial polymer crosslinking and increases viscosity from about $0.11 \times 10^6$ Pa·s to about 100 Pa·s to about $1 \times 10^8$ Pa·s in some embodiments. The second heating at about 170° C. to about 300° C. causes further polymer crosslinking and increases the viscosity from about 100 Pa·s to about $1 \times 10^8$ Pa·s to a solid state layer. First heating temperatures below about 100° C. may result in insufficient partial crosslinking. First heating temperatures above about 170° C. may result in negligible additional partial crosslinking, or may prematurely trigger the second crosslinker. In some embodiments, the SOC layer 15 is heated at the first temperature for about 10 seconds to about 5 minutes to partially crosslink the SOC layer 15. In some embodiments, the first heating is performed for about 30 seconds to about 3 minutes. In some embodiments, the second heating is performed for about 30 seconds to about 3 minutes.

Figure 3:
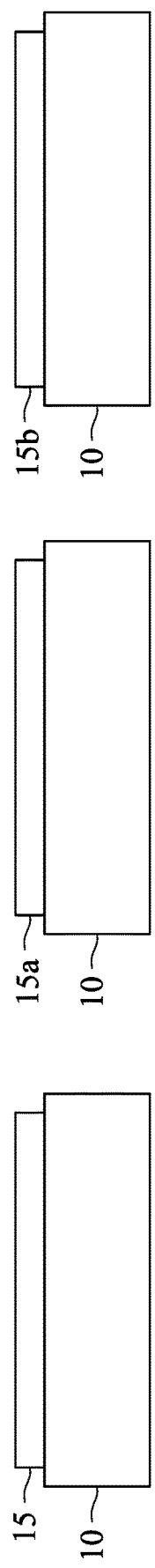
FIG. 3 is a cross sectional view of a sequential operation for manufacturing a semiconductor device according to an embodiment of the disclosure.

After the first heating, the SOC layer 15a is allowed to cool at about 20° C. to about 25° C. for about 10 s to about 1 min. Then the SOC layer 15a is subsequently subjected to a second heating at a second temperature higher than the first temperature to form a further or fully crosslinked SOC layer 15b, as shown in FIG. 3. In some embodiments, the second temperature ranges from about 170° C. to about 300° C. In some embodiments, the second temperature ranges from about 180° C. to about 300° C. In some embodiments, the second temperature ranges from about 200° C. to about 280° C. Second heating at temperatures below about 170° C. may result in insufficient crosslinking. Second heating temperatures above about 300° C. may result in an unacceptable increase in SOC layer reflow or decomposition or degradation of the organic material forming the SOC layer 15b. In some embodiments, the SOC layer 15a is heated at the second temperature for about 30 seconds to about 3 minutes. In other embodiments, the second heating is performed for about 30 seconds to about 2 minutes. After the second heating, the SOC layer 15b is allowed to cool at about 20° C. to about 25° C. for about 10 s to about 1 min before performing subsequent process on the SOC layer 15b coated substrate.

Figure 4:
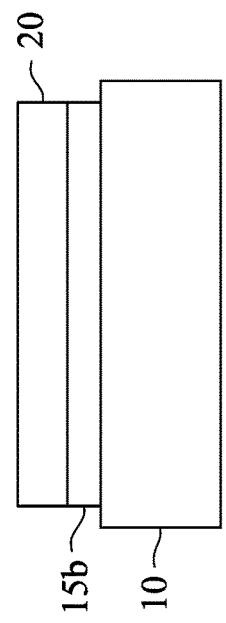
FIG. 4 is a cross sectional view of a sequential operation for manufacturing a semiconductor device according to an embodiment of the disclosure.

An overlying layer 20 is subsequently formed over the crosslinked SOC layer 15b, as shown in FIG. 4. In some embodiments, the overlying layer 20 is a photoresist layer, a hard mask layer, a polymer layer, or any other suitable layer. In some embodiments, the overlying layer 20 is a photoresist layer made of a photoresist composition. In some embodiments, the substrate 10 is rotated (spinned) during or after the photoresist layer 20 is deposited, evenly spreading the photoresist composition across the surface of the cross-linked SOC layer 15b.

The photoresist layer 20 is a photosensitive layer that is patterned by exposure to actinic radiation and development. Typically, the chemical properties of the photoresist regions struck by incident radiation change in a manner that depends on the type of photoresist used. Whether a resist is positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

Photoresists according to the present disclosure include a polymer along with one or more photoactive compounds (PACs) in a solvent, in some embodiments. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

The group which will decompose, otherwise known as a leaving group or, in some embodiments in which the PAC is a photoacid generator, an acid labile group, is attached to the hydrocarbon structure so that it will react with the acids/bases/free radicals generated by the PACs during exposure.

In some embodiments, the polymer is a polyhydroxystyrene, polyacrylate, or polymethylmethacrylate based polymer.

Additionally, some embodiments of the photoresist include one or more photoactive compounds (PACs). The PACs are photoactive components, such as photoacid generators, photobase generators, free-radical generators, or the like. The PACs may be positive-acting or negative-acting.

In some embodiments, a cross-linking agent is added to the photoresist composition. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist without the cross-linking agent, the coupling reagent is used to couple one group from one of the hydrocarbon structures in the polymer to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

Some embodiments of the photoresist are metal-containing photoresists. In some embodiments, the metal-containing photoresist forms a metal-containing photoresist layer.

The metals in the metal-containing photoresist includes one or more of Cs, Ba, La, Ce, In, Sn, or Ag in some embodiments.

In some embodiments, the metal-containing photoresist includes metal oxide nanoparticles. The metal oxides nanoparticles are selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof in some embodiments. As used herein, nanoparticles are particles having an average particle size between 1 and 10 nm. In some embodiments, the metal oxide nanoparticles have an average particle size between 2 and 5 nm. In some embodiments, the amount of metal oxide nanoparticles in the photoresist composition ranges from about 1 wt. % to about 10 wt. % based on the total weight of the photoresist composition. In some embodiments, metal oxide nanoparticle concentrations below 1 wt. % provide photoresist layers that are too thin, and metal oxide nanoparticle concentrations greater than about 10 wt. % provide a photoresist composition that is too viscous and that will be difficult to provide a photoresist coating of uniform thickness on the substrate.

In some embodiments, the metal oxide nanoparticles are complexed with carboxylic acid or sulfonic acid ligands. For example, in some embodiments, zirconium oxide or hafnium oxide nanoparticles are complexed with methacrylic acid forming hafnium methacrylic acid (HfMAA) or zirconium methacrylic acid (ZrMAA). In some embodiments, the HfMAA or ZrMAA are dissolved at about a 5 wt. % to about 10 wt. % weight range in a coating solvent, such as propylene glycol methyl ether acetate (PGMEA). In some embodiments, about 1 wt. % to about 10 wt. % of a photoactive compound (PAC) based on the total weight of the photoresist composition to form a metal oxide resist.

The individual components of the photoresist composition are placed into a solvent in order to aid in the mixing and dispensing of the photoresist. To aid in the mixing and dispensing of the photoresist, the solvent is chosen at least in part based upon the materials chosen for the polymers as well as the PAC. In some embodiments, the solvent is chosen such that the polymer resins and the PAC can be evenly dissolved into the solvent and dispensed upon the layer to be patterned. In some embodiments, the solvent is an organic solvent, and includes one or more of any of the solvents disclosed herein as suitable solvents for the SOC composition.

In some embodiments, the method includes a third heating of the photoresist layer 20 and SOC layer 15b at a temperature of about 40° C. to about 140° C. for 10 seconds to 5 minutes after the photoresist layer 20 is disposed over the SOC layer 15b. The third heating removes solvent from the photoresist layer. In some embodiments, the photoresist layer 20 and the SOC layer 15b are heated at a temperature of about 60° C. to about 120° C. for 20 seconds to 3 minutes.

Figure 5:
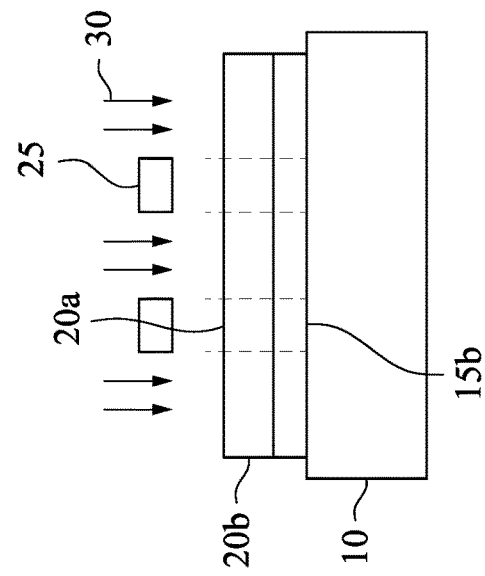
FIG. 5 is a cross sectional view of a sequential operation for manufacturing a semiconductor device according to an embodiment of the disclosure.

Then, as shown in FIG. 5, a portion of the photoresist layer 20b is selectively exposed to actinic radiation 30. In some embodiments, a mask 25 is used to form exposed portions 20b and unexposed portions 20a of the photoresist layer.

Figure 6B:
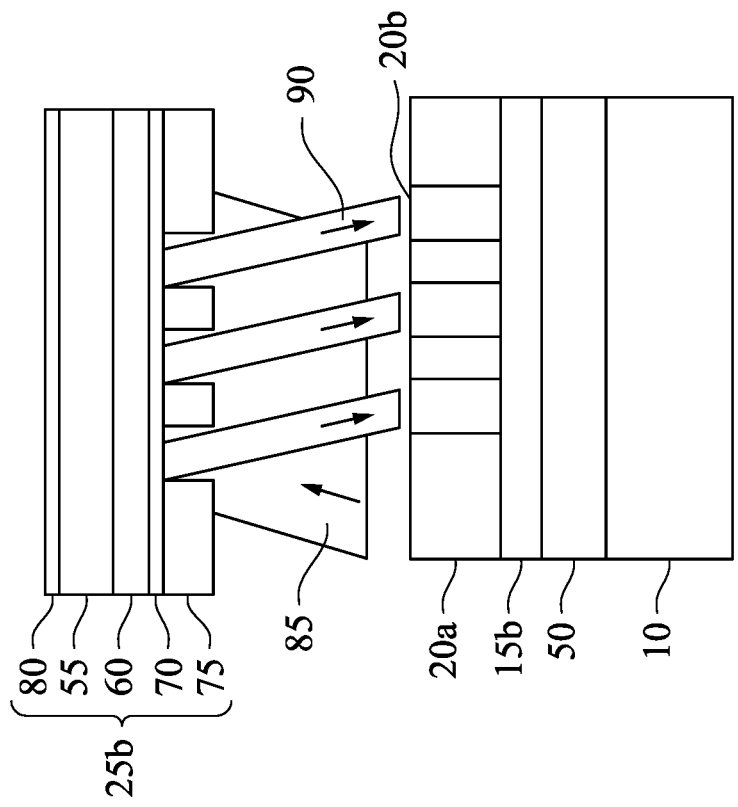
FIGS. 6A and 6B show process stages of a sequential operation according to embodiments of the disclosure.
Figure 6A:
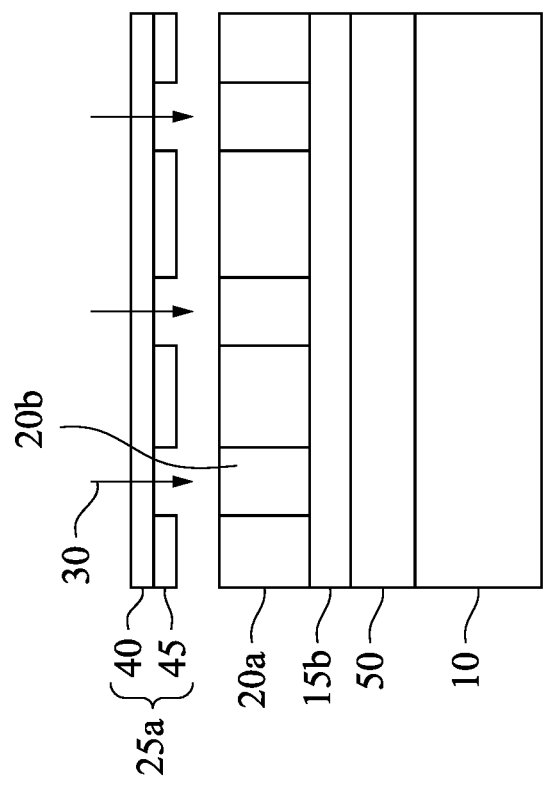

FIGS. 6A and 6B are detailed views illustrating the selective exposures of the photoresist layer 20 to form the exposed portions 20b and unexposed portions 20a. In some embodiments, the exposure to radiation is carried out by placing the photoresist-coated substrate in a photolithography tool. The photolithography tool includes a photomask 25a, 25b, optics, an exposure radiation source to provide the radiation 30/90 for exposure, and a movable stage for supporting and moving the substrate under the exposure radiation.

In some embodiments, the radiation source (not shown) supplies radiation 30/90, such as ultraviolet light, to the photoresist layer 20 in order to induce a reaction of the photoactive compounds in the photoresist, which in turn reacts with the polymer in the photoresist to chemically alter those regions of the photoresist layer 20b to which the radiation 30/90 impinges. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 30/90 is patterned by the photomask 25a/25b. In some embodiments, the optics include one or more lenses, mirrors, filters, and combinations thereof to control the radiation 30/90 along its path.

In an embodiment, the patterned radiation 30/90 is extreme ultraviolet light having a 13.5 nm wavelength, the photoactive compound (PAC) is a photoacid generator, the group to be decomposed is an acid-labile group (ALG) pendant to the hydrocarbon main chain structure of the polymer. In some embodiments, a cross linking agent is used. The patterned radiation 30/90 impinges upon the photoacid generator and the photoacid generator absorbs the impinging patterned radiation 30/90. This absorption initiates the photoacid generator to generate a proton (e.g., a $H^+$ atom) within the photoresist layer 20b. When the proton impacts the ALG on the hydrocarbon structure, the proton reacts with the ALG, chemically altering the ALG and altering the properties of the polymer in general. The acid generated by the photoacid generator in the photoresist 20 cleaves the ALG on polymer with the pendant ALG, thereby increasing the polymer's solubility in the developer.

As shown in FIG. 6A, the exposure radiation 30 passes through a photomask 25a before irradiating the photoresist layer 20 in some embodiments. In some embodiments, the photomask has a pattern to be replicated in the photoresist layer 20. The pattern is formed by an opaque pattern 45 on the photomask substrate 40, in some embodiments. The opaque pattern 45 may be formed by a material opaque to ultraviolet radiation, such as chromium, while the photomask substrate 40 is formed of a material that is transparent to ultraviolet radiation, such as fused quartz.

In some embodiments, the selective exposure of the photoresist layer 20 to form exposed regions 20b and unexposed regions 20a is performed using extreme ultraviolet lithography. In an extreme ultraviolet lithography operation, a reflective photomask 25b is used to form the patterned exposure light, as shown in FIG. 6B. The reflective photomask 25b includes a low thermal expansion glass substrate 55, on which a reflective multilayer 60 of Si and Mo is formed. A capping layer 70 and absorber layer 75 are formed on the reflective multilayer 60. A rear conductive layer 80 is formed on the backside of the low thermal expansion substrate 55. In extreme ultraviolet lithography, extreme ultraviolet radiation 85 is directed towards the reflective photomask 25b at an incident angle of about 6°. A portion 90 of the extreme ultraviolet radiation is reflected by the Si/Mo multilayer 60 towards the photoresist-coated substrate 10, while the portion of the extreme ultraviolet radiation incident upon the absorber layer 75 is absorbed by the photomask. In some embodiments, additional optics, including mirrors, are between the reflective photomask 25b and the photoresist-coated substrate.

In some embodiments, the exposure of the photoresist layer 20 uses an immersion lithography technique. In such a technique, an immersion medium (not shown) is placed between the final optics and the photoresist layer 20, and the exposure radiation 30 passes through the immersion medium.

As a result of the exposure operation, a latent pattern is formed in the resist layer 20. The latent pattern of the photoresist layer refers to the exposed pattern in the photoresist layer 20, which eventually becomes a physical resist pattern, such as by a developing operation. The latent pattern of the resist layer 20 includes unexposed portions 20a and exposed portions 20b. In an embodiment using a chemically amplified (CA) resist material with a photoacid generator (PAG), acids are generated in the exposed portions 20b during the exposure process. In the latent pattern, the exposed portions 20b of the photoresist layer 20 are physically or chemically changed. In some examples, the exposed portions 20b are de-protected, inducing polarity change for dual-tone imaging (developing).

The selectively exposed photoresist layer 20 is then subjected to a fourth heating in some embodiments. The fourth heating of the selectively exposed photoresist layer, also known as a post-exposure baking (PEB) operation, is performed at a temperature of about 80° C. to about 300° C. for about 10 seconds to about 10 minutes. In some embodiments, the PEB is performed at a temperature of about 100° C. to about 200° C. for about 10 seconds to about 10 minutes. During the PEB operation, more acid is generated in the exposed portions 20b of the photoresist layer. The generated acid furthers the chemical changes in the photoresist layer and photoresist under-layer. In some embodiments, crosslinking occurs during the PEB. In some embodiments, the PEB heating temperature is in a range of about 130° C. to about 170° C. for about 30 seconds to about 5 minutes.

Figure 7:
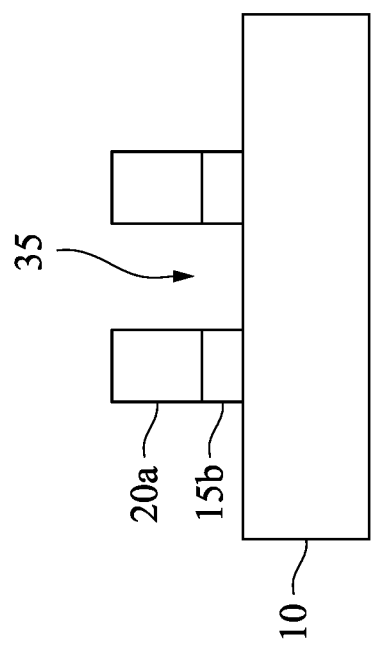
FIG. 7 is a cross sectional view of a sequential operation for manufacturing a semiconductor device according to an embodiment of the disclosure.

Development is subsequently performed, as shown in FIG. 7, using a solvent, to form a pattern 35 in the photoresist layer and SOC layer, in some embodiments. In some embodiments, the SOC layer 15b is soluble in the photoresist developer. In other embodiments, the exposed portions of the SOC layer 15 are removed using a different solvent than the photoresist developer or by etching after the photoresist layer is developed.

In some embodiments where positive tone development is desired, a positive tone developer such as a basic aqueous solution is used to remove the radiation exposed regions 20b of the photoresist layer.

In some embodiments, the developer is applied to the photoresist layer using a spin-on process. In the spin-on process, the developer is applied to the photoresist layer by a dispenser from above while the coated substrate is rotated. In some embodiments, the developer is supplied at a rate of between about 5 ml/min and about 800 ml/min, while the coated substrate is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer after exposure, it is intended to be illustrative and is not intended to limit the embodiment. Rather, any suitable development operations, including dip processes, puddle processes, and spray-on methods, may alternatively be used. All such development operations are included within the scope of the embodiments.

Figure 8:
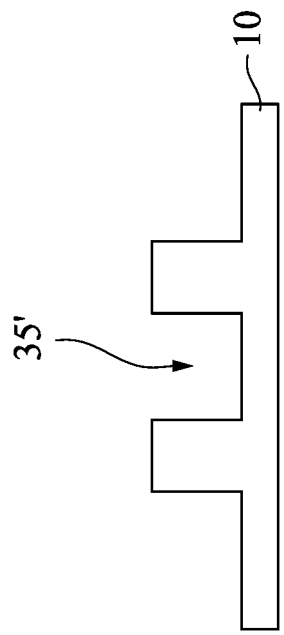
FIG. 8 is a cross sectional view of a sequential operation for manufacturing a semiconductor device according to an embodiment of the disclosure.

Additional processing is performed while the patterned photoresist layer 20a and SOC layer 15b are in place in some embodiments. For example, an etching operation, using dry or wet etching, is performed in some embodiments, to transfer the pattern 35 of the photoresist layer to the substrate 10, thereby forming pattern 35' in the substrate. The remaining photoresist layer and SOC layer are subsequently removed by a suitable stripping, ashing, or etching operation, as shown in FIG. 8.

FIG. 9 illustrates an example of the crosslinking operations according to embodiments of the disclosure. In an embodiment, the SOC layer includes a main polymer, such as polyhydroxystyrene, a low activation energy (Ea) crosslinker with four alkoxy crosslinking groups, and a high activation energy (Ea) crosslinker with four hydroxyl groups. The SOC layer is subjected to a low temperature baking operation, such as heating at about 130° C., which triggers the low Ea crosslinker to partially crosslink the main polymer. Then, a high temperature baking operation is performed, such as heating at about 250° C., which triggers the high Ea crosslinker to more fully crosslink the main polymer.

Figure 11:
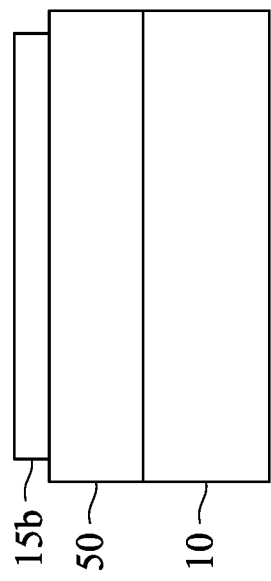
FIG. 11 is a cross sectional view of a sequential operation for manufacturing a semiconductor device according to an embodiment of the disclosure.
Figure 10:
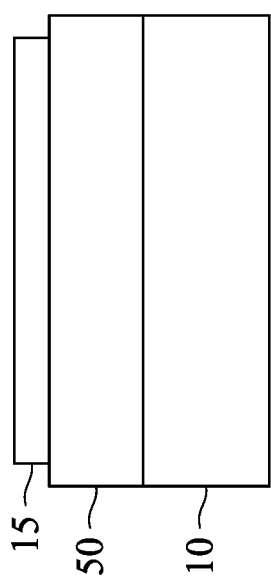
FIG. 10 is a cross sectional view of a sequential operation for manufacturing a semiconductor device according to an embodiment of the disclosure.
Figure 12:
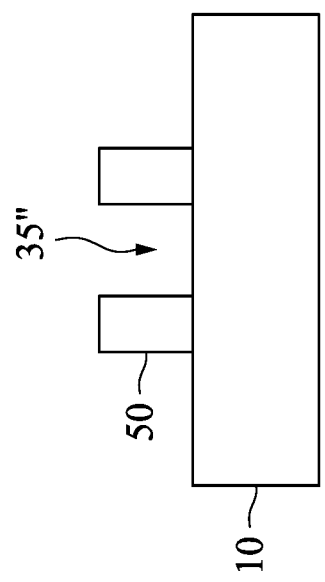
FIG. 12 is a cross sectional view of a sequential operation for manufacturing a semiconductor device according to an embodiment of the disclosure.

FIGS. 10-12 are cross sectional views of an alternative embodiment of manufacturing a semiconductor device according to the disclosure. FIG. 10 illustrates a semiconductor substrate 10 with a layer to be patterned 50 disposed thereon, and the SOC layer 15 disposed over the layer to be patterned 50. In some embodiments, the layer to be patterned 50 is a hard mask layer; metallization layer; or a dielectric layer, such as a passivation layer, disposed over a metallization layer. In embodiments where the layer to be patterned 50 is a metallization layer, the layer to be patterned 50 is formed of a conductive material using metallization processes, and metal deposition techniques, including chemical vapor deposition, atomic layer deposition, and physical vapor deposition (sputtering). Likewise, if the layer to be patterned 50 is a dielectric layer, the layer to be patterned 50 is formed by dielectric layer formation techniques, including thermal oxidation, chemical vapor deposition, atomic layer deposition, and physical vapor deposition.

The substrate 10 with the layer to be patterned 50 and SOC layer 15 disposed thereon, is subsequently processed in a similar manner as discussed herein with reference to FIGS. 2 and 3 to form the fully crosslinked SOC layer 15b, as shown in FIG. 11. Then, the structure of FIG. 11 is processed in a similar manner as discussed herein with reference to FIGS. 4-7, and the substrate 10 with and the layer to be patterned 50 is etched using the photoresist/SOC layer pattern 35 as an etch mask to form a pattern 35" in the layer to be patterned 50, as shown in FIG. 12. The layer to be patterned 50 may be etched by wet or dry etching depending on the materials to be etched and the desired configuration of the pattern 35".

Figure 13:
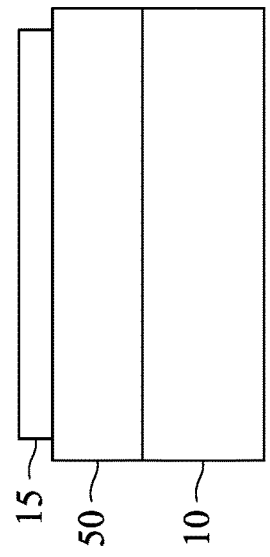
FIG. 13 is a cross sectional view of a sequential operation for manufacturing a semiconductor device according to an embodiment of the disclosure.
Figure 14:
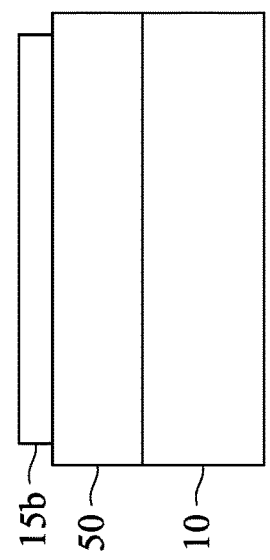
FIG. 14 is a cross sectional view of a sequential operation for manufacturing a semiconductor device according to an embodiment of the disclosure.

FIGS. 13-18 are cross sectional views of an alternative embodiment of manufacturing a semiconductor device according to the disclosure. FIG. 13 illustrates an SOC layer 15 disposed over a semiconductor substrate 10. In some embodiments, the SOC layer 15 disposed over an optional layer to be patterned 50, which is disposed over the substrate 10. The SOC layer-coated substrate is subsequently processed in a similar manner as discussed herein with reference to FIGS. 2 and 3 or FIGS. 10 and 11 to form the fully crosslinked SOC layer 15b, as shown in FIG. 14.

Figure 15:
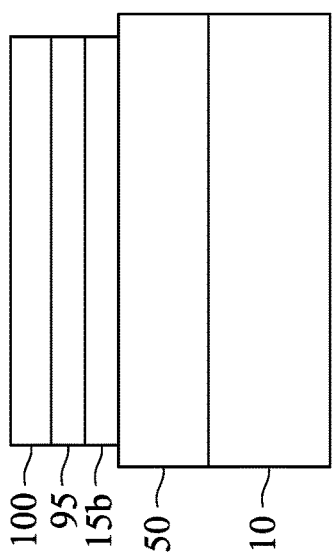
FIG. 15 is a cross sectional view of a sequential operation for manufacturing a semiconductor device according to an embodiment of the disclosure.

The fully crosslinked SOC layer 15b is a bottom layer of a trilayer resist in some embodiments. As shown in FIG. 15, a middle layer 95 and photoresist layer 100 of the trilayer resist are subsequently disposed over the bottom layer 15b.

The middle layer 95 of the trilayer resist structure may have a composition that provides anti-reflective properties for the photolithography operation and/or hard mask properties. In some embodiments, the middle layer 95 includes a silicon containing layer (e.g., a silicon hard mask material). The middle layer 95 may include a silicon-containing inorganic polymer. In other embodiments, the middle layer 95 includes a siloxane polymer. In other embodiments, the middle layer 95 includes silicon oxide (e.g., spin-on glass (SOG)), silicon nitride, silicon oxynitride, polycrystalline silicon, a metal-containing organic polymer material that contains a metal such as titanium, titanium nitride, aluminum, and/or tantalum; and/or other suitable materials. The middle layer 95 may be bonded to adjacent layers, such as by covalent bonding, hydrogen bonding, or hydrophilic-to-hydrophilic forces.

The photoresist layer 100 may include any of the photoresist compositions disclosed in reference to FIG. 4.

Figure 16:
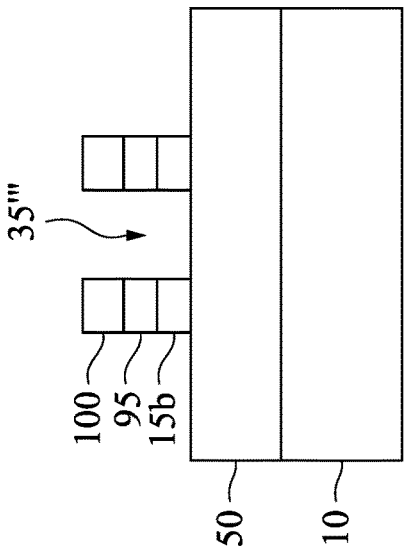
FIG. 16 is a cross sectional view of a sequential operation for manufacturing a semiconductor device according to an embodiment of the disclosure.
Figure 17:
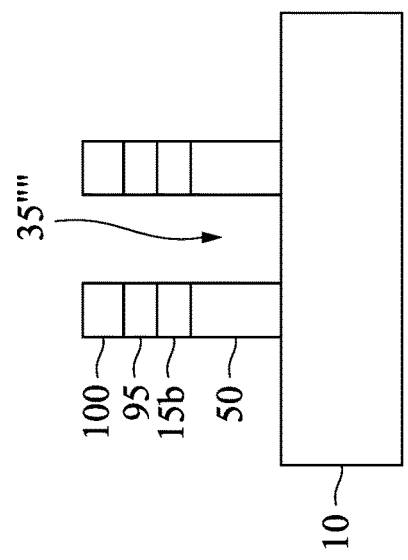
FIG. 17 is a cross sectional view of a sequential operation for manufacturing a semiconductor device according to an embodiment of the disclosure.
Figure 18:
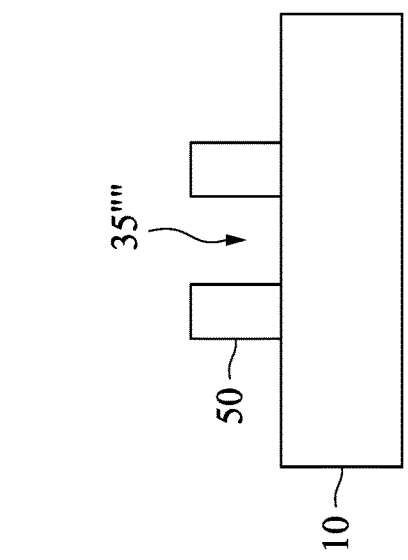
FIG. 18 is a cross sectional view of a sequential operation for manufacturing a semiconductor device according to an embodiment of the disclosure.

The structure of FIG. 15 is subsequently processed in a similar manner as disclosed herein with reference to FIGS. 5 to 7 to develop the photoresist layer 100. Then, the optional layer to be patterned 50, and the middle layer 95 and bottom layer 15b are etched using the patterned photoresist as an etch mask to form a pattern 35''', as shown in FIG. 16. The middle layer 95, and bottom layer 15b may be etched by wet or dry etching depending on the materials to be etched and the desired configuration of the pattern 35'''. In some embodiments, the pattern 35''' in the middle layer 95 and bottom layer 15b is extended into the substrate 10 or the optional layer to be patterned 50 using suitable wet or dry etching operations to form a pattern 35'''', as shown in FIG. 17, in the optional layer to be patterned 50 or substrate 10. Then, the remaining portions of the trilayer resist are removed by one or more stripping or etching operations, as shown in FIG. 18.

Figure 19:
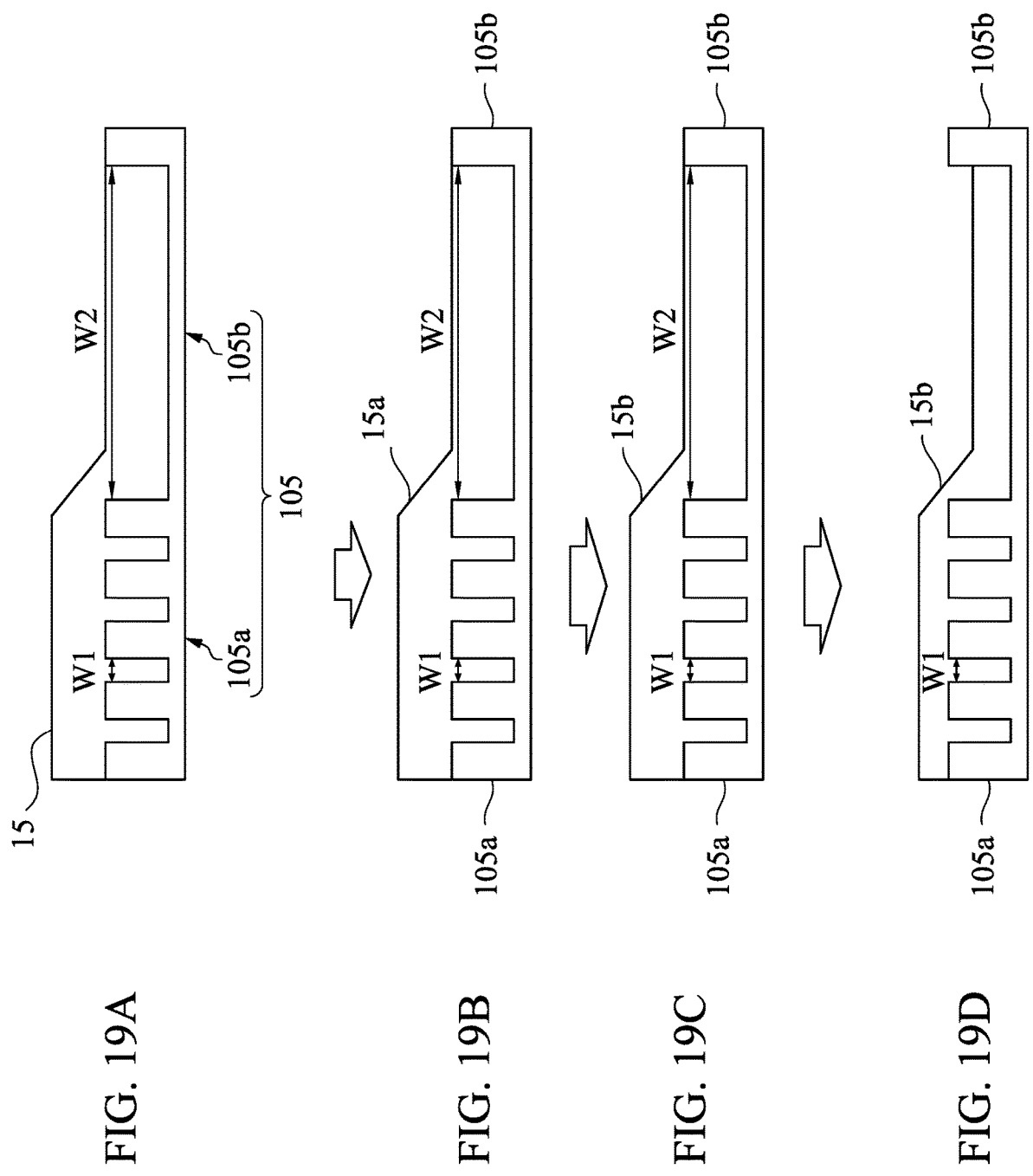
FIGS. 19A, 19B, 19C, and 19D are cross sectional views of a sequential operation for manufacturing a semiconductor device according to an embodiment of the disclosure.

In some embodiments, the SOC layer 15 is formed over a patterned substrate 105, as shown in FIG. 19A. The patterned substrate 105 includes a main pattern region 105a where pattern features have a fine pitch and are spaced apart by a distance W1, and a coarse pattern region 105b where pattern features are more widely separated by a distance W2. In some embodiments W1 is less than about 20 nm. In some embodiments, W1 ranges from about 5 nm to about 20 nm. In other embodiments, W1 ranges from about 10 nm to about 15 nm. In some embodiments, W2 is greater than about 80 nm. In some embodiments, W2 ranges from about 80 nm to about 200 nm. In other embodiments, W2 ranges from about 100 nm to about 150 nm.

The structure of FIG. 19A is subsequently heated at the first heating temperature to form a partially crosslinked SOC layer 15a, as shown in FIG. 19B. Because the first heating temperature is sufficiently low, there is little or no reflow of the SOC layer 15a. Then the structure of FIG. 19B is heated at the higher second temperature to form a further or fully crosslinked SOC layer 15b, as shown in FIG. 19C. The partially crosslinked SOC layer 15a resists reflow during the higher temperature second heating. Therefore, a sufficient height of the SOC layer 15b is maintained over the main pattern region 105a to protect the main pattern feature 105a during subsequent processing. As shown in FIG. 19D, after subsequent processing, such as etching, a portion of the SOC layer 15b remains over the main pattern. Thus, because the SOC layer reflow is inhibited, the main pattern region 105a is protected from damage during subsequent processing operations.

Figure 20:
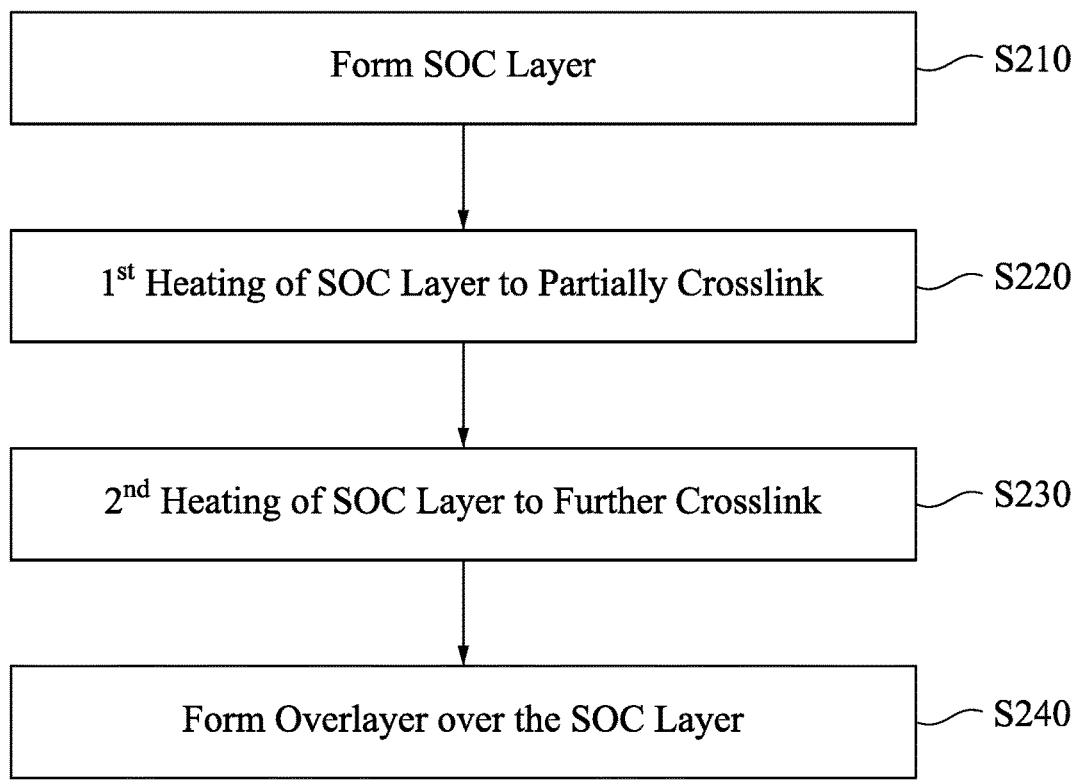
FIG. 20 illustrates a process flow of a method for manufacturing a semiconductor device according to embodiments of the disclosure.

FIG. 20 is a flowchart illustrating a method 200 according to embodiments of the present disclosure. In operation S210, a spin on carbon layer 15 is formed over a substrate 20. The spin on carbon layer 15 is first heated at a first temperature to partially crosslink the spin on carbon layer in operation S220. Then in operation S230, the spin on carbon layer 15a is second heated at a second temperature to further crosslink the spin on carbon layer 15b. The second temperature is higher than the first temperature. An overlayer 20 is formed over the spin on carbon layer in operation S240. In some embodiments, the overlayer 20 is a photoresist layer, a hard mask layer, a polymer layer, or any other suitable layer.

Figure 21:
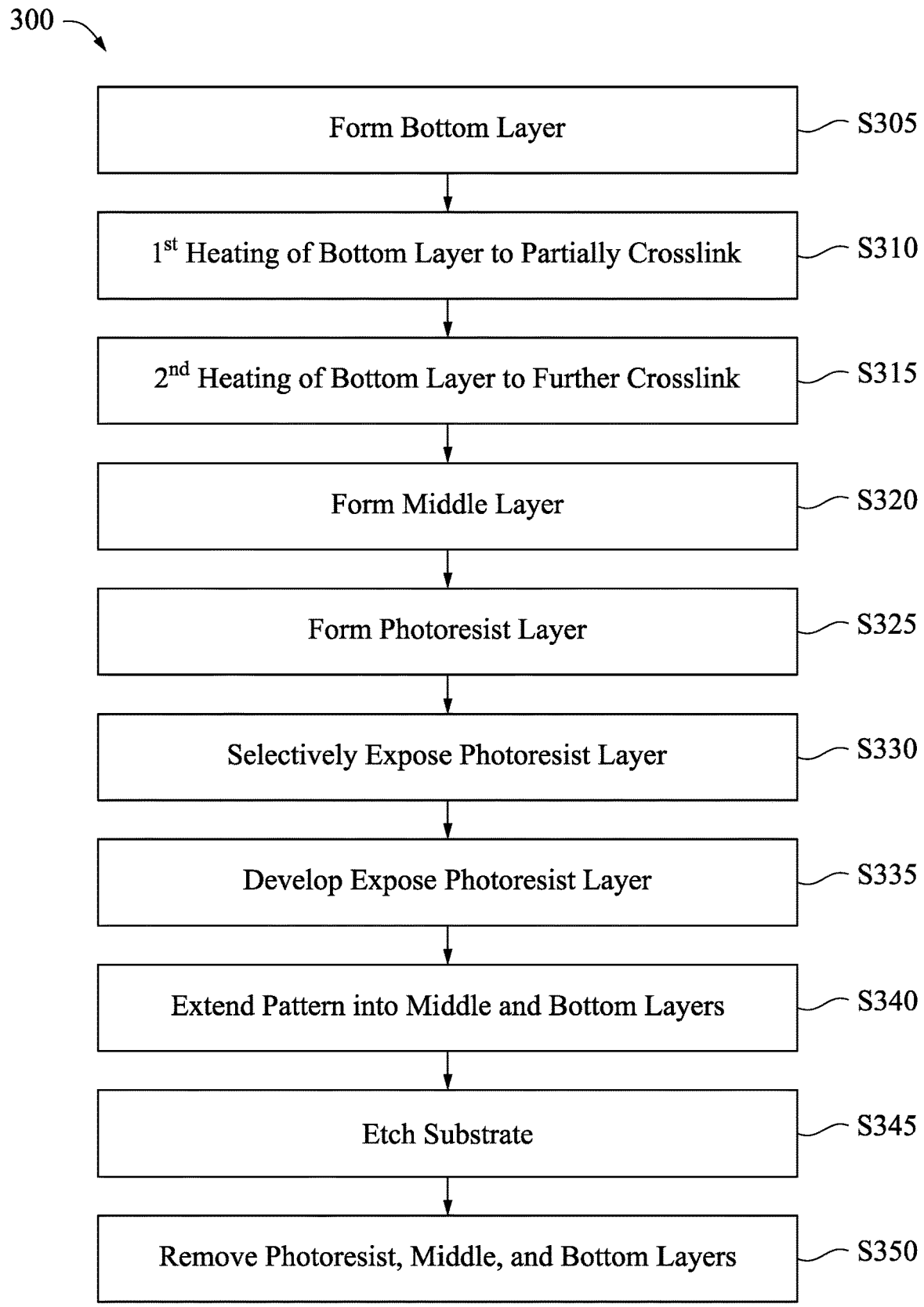
FIG. 21 illustrates a process flow of a method for manufacturing a semiconductor device according to embodiments of the disclosure.

FIG. 21 is a flowchart illustrating a method 300 according to embodiments of the present disclosure. In operation S305, a bottom layer 15 is formed over a semiconductor substrate 10, 50. In some embodiments, the bottom layer 15 includes: a carbon backbone polymer, a first crosslinker, and a second crosslinker. The bottom layer 15 is first heated at a first temperature to partially crosslink the bottom layer via the first crosslinker in operation S310. The bottom layer 15a is then second heated at a second temperature higher than the first temperature to further crosslink the bottom layer via the second crosslinker in operation S315. In operation S320, a middle layer 95 is formed over the bottom layer 15b, and a photoresist layer 100 is formed over the middle layer 95 in operation S325. The middle layer has a different composition than the bottom layer and photoresist layer. In some embodiments, the photoresist layer 100 is selectively exposed to actinic radiation in operation S320, and then developed in operation S325 to form a photoresist pattern. In operation S330, the pattern is extended into the middle layer 95 and bottom layer 15b to expose the substrate 10. In some embodiments, the substrate 10, 50 is subsequently etched in operation S345, and the photoresist layer, middle layer, and bottom layer are removed in operation S350.

Additional processing operations are performed in some embodiments to manufacture semiconductor devices. In some embodiments, the fabrication process includes an ion implantation process applied to the wafer using the patterned resist layer as an implantation mask, thereby forming various doped features in the wafer.

Other embodiments include other operations before, during, or after the operations described above. In an embodiment, the method includes forming fin field effect transistor (FinFET) structures. In some embodiments, a plurality of active fins are formed on the semiconductor substrate. Such embodiments, further include etching the substrate through the openings of the patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In another embodiment, the method includes other operations to form a plurality of gate electrodes on the semiconductor substrate. The method may further include forming gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, the semiconductor substrate 10 is an intermediate structure fabricated during processing of an IC, or a portion thereof, that may include logic circuits, memory structures, passive components (such as resistors, capacitors, and inductors), and active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Embodiments of the present disclosure provide improved coverage and planarization by spin on carbon layers. Spin on carbon compositions and methods according to the present disclosure inhibit reflow of the spin on carbon layers. By reducing reflow of the spin on carbon layer, excessive thinning of the SOC layer over the substrate is prevented. Thus, damage to the substrate or features formed on the substrate is prevented during subsequent processing of the photoresist device.

An embodiment of the disclosure is a method of manufacturing a semiconductor device, including forming a spin on carbon layer comprising a spin on carbon composition over a semiconductor substrate. The spin on carbon layer is first heated at a first temperature to partially crosslink the spin on carbon layer. The spin on carbon layer is second heated at a second temperature to further crosslink the spin on carbon layer. An overlayer is formed over the spin on carbon layer. The second temperature is higher than the first temperature. In an embodiment, the spin on carbon composition comprises a carbon backbone polymer, a first crosslinker, and a second crosslinker, wherein the first and second crosslinkers are different from each other. In an embodiment, the first crosslinker is one or more selected from the group consisting of A-(OR)$_x$, A-(NR)$_x$,

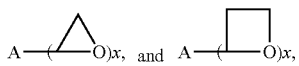

where A is a monomer, oligomer, or a polymer having a molecular weight ranging from 100 to 20,000; R is an alkyl group, cycloalkyl group, cycloalkylepoxy group, or C3-C15 heterocyclic group; OR is an alkyloxy group, cycloalkyloxy group, carbonate group, alkylcarbonate group, alkyl carboxylate group, tosylate group, or mesylate group; NR is an alkylamide group or an alkylamino group; and x ranges from 2 to 1000. In an embodiment, R, OR, and NR each comprise a chain structure, a ring structure, or a 3-D structure. In an embodiment, the second crosslinker is one or more selected from the group consisting of A-(OH)$_x$, A-(OR')$_x$, A-(C=C)$_x$, and A-(C≡C)$_x$, where A is a monomer, oligomer, or a polymer having a molecular weight ranging from 100 to 20,000; R' is an alkyloxy group, an alkenyl group, or an alkynyl group; and x ranges from 2 to 1000. In an embodiment, a concentration of the first and second crosslinkers in the spin on carbon composition ranges from 20 wt. % to 50 wt. % of the total weight of the first and second crosslinkers and the carbon backbone polymer. In an embodiment, the first crosslinker reacts with the carbon backbone polymer during the first heating to partially crosslink the carbon backbone polymer. In an embodiment, the second crosslinker reacts with the carbon backbone polymer during the second heating to further crosslink the carbon backbone polymer. In an embodiment, the first temperature ranges from 100° C. to 170° C. In an embodiment, the second temperature ranges from 180° C. to 300° C. In an embodiment, the first temperature ranges from 100° C. to 150° C. In an embodiment, the second temperature ranges from 200° C. to 280° C. In an embodiment, the carbon backbone polymer is a polyhydroxystyrene.

Another embodiment of the disclosure is a method of manufacturing a semiconductor device, including forming a bottom layer over a semiconductor substrate. The bottom layer includes: a carbon backbone polymer, a first crosslinker, and a second crosslinker. The bottom layer is first heated at a first temperature to partially crosslink the bottom layer via the first crosslinker. The bottom layer is second heated at a second temperature higher than the first temperature to further crosslink the bottom layer via the second crosslinker. A middle layer is formed over the bottom layer, and a photoresist layer is formed over the middle layer. The middle layer has a different composition than the bottom layer and photoresist layer. In an embodiment, the first crosslinker is one or more selected from the group consisting of A-(OR)$_x$, A-(NR)$_x$,

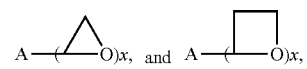

where A is a monomer, oligomer, or a polymer having a molecular weight ranging from 100 to 20,000; R is an alkyl group, cycloalkyl group, cycloalkylepoxy group, or C3-C15 heterocyclic group; OR is an alkyloxy group, cycloalkyloxy group, carbonate group, alkylcarbonate group, alkyl carboxylate group, tosylate group, or mesylate group; NR is an alkylamide group or an alkylamino group; and x ranges from 2 to 1000. In an embodiment, the second crosslinker is one or more selected from the group consisting of A-(OH)$_x$, A-(OR')$_x$, A-(C=C)$_x$, and A-(C≡C)$_x$, where A is a monomer, oligomer, or a polymer having a molecular weight ranging from 100 to 20,000; R' is an alkyloxy group, an alkenyl group, or an alkynyl group; and x ranges from 2 to 1000. In an embodiment, the middle layer includes at least one selected from the group consisting of a silicon-containing material containing inorganic polymer, a siloxane polymer, silicon oxide, silicon nitride, silicon oxynitride, polycrystalline silicon, and a metal-containing organic polymer material. In an embodiment, the method includes selectively exposing the photoresist layer to actinic radiation, developing the selectively exposed photoresist layer to form a photoresist pattern, extending the pattern into the middle layer and bottom layer to expose the substrate, etching the substrate, and removing the photoresist layer, middle layer, and bottom layer. In an embodiment, the first temperature ranges from 100° C. to 170° C. In an embodiment, the first temperature ranges from 100° C. to 150° C. In an embodiment, the second temperature ranges from 180° C. to 300° C. In an embodiment, the second temperature ranges from 200° C. to 280° C. In an embodiment, R, OR, and NR comprise a chain structure, a ring structure, or a 3-D structure. In an embodiment, the middle layer is a silicon-containing hard mask.

Another embodiment of the disclosure is a spin on carbon composition, including a carbon backbone polymer, a first crosslinker, and a second crosslinker. The first crosslinker reacts with the carbon backbone polymer to partially crosslink the carbon backbone polymer at first temperature, and the second crosslinker reacts with the carbon backbone polymer to further crosslink the carbon backbone polymer at a second temperature higher than the first temperature. In an embodiment, the first crosslinker is one or more selected from the group consisting of A-(OR)$_x$, A-(NR)$_x$,

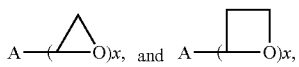

where A is a monomer, oligomer, or a second polymer having a molecular weight ranging from 100 to 20,000; R is an alkyl group, cycloalkyl group, cycloalkylepoxy group, or C3-C15 heterocyclic group; OR is an alkyloxy group, cycloalkyloxy group, carbonate group, alkylcarbonate group, alkyl carboxylate group, tosylate group, or mesylate group; NR is an alkylamide group or an alkylamino group; and x ranges from 2 to 1000. In an embodiment, the second crosslinker is one or more selected from the group consisting of A-(OH)$_x$, A-(OR')$_x$, A-(C=C)$_x$, and A-(C≡C)$_x$, where A is a monomer, oligomer, or a second polymer having a molecular weight ranging from 100 to 20,000; R' is an alkyloxy group, an alkenyl group, or an alkynyl group; and x ranges from 2 to 1000. In an embodiment, a concentration of the first and second crosslinkers ranges from 20 wt. % to 50 wt. % of the total weight of the first and second crosslinkers and the carbon backbone polymer. In an embodiment, the spin on carbon composition includes a solvent. In an embodiment, the carbon backbone polymer is a polyhydroxystyrene. In an embodiment, R is $(CH_2)_y CH_3$, where $0 \leq y \leq 14$. In an embodiment, OR is $(-O(CH_2CH_2O)_a-CH_2CH_3)$, where $1 \leq a \leq 6$. In an embodiment, R is $(CH_2)_y CH_3$, where $0 \leq y \leq 14$. In an embodiment, R, OR, and NR each include a chain structure, a ring structure, or a 3-D structure. In an embodiment, a concentration of the first crosslinker is same as a concentration of the second crosslinker. In an embodiment, the 3-D structure is selected from the group consisting of norbornyl, adamantyl, basketanyl, twistanyl, cubanyl, and dodecahedranyl groups.

Another embodiment of the disclosure is a method of manufacturing a semiconductor device, including forming a spin on carbon layer over a semiconductor substrate. The spin on carbon layer includes a carbon backbone polymer; a first crosslinker selected from the group consisting of A-(OR)$_x$, A-(NR)$_x$,

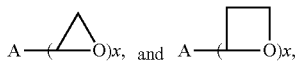

where A is a monomer, oligomer, or a polymer having a molecular weight ranging from 100 to 20,000; R is an alkyl group, cycloalkyl group, cycloalkylepoxy group, or C3-C15 heterocyclic group; OR is an alkyloxy group, cycloalkyloxy group, carbonate group, alkylcarbonate group, alkyl carboxylate group, tosylate group, or mesylate group; NR is an alkylamide group or an alkylamino group; and x ranges from 2 to 1000; and a second crosslinker selected from the group consisting of A-(OH)$_x$, A-(OR')$_x$, A-(C=C)$_x$, and A-(C≡C)$_x$, where A is a monomer, oligomer, or a polymer having a molecular weight ranging from 100 to 20,000; R' is an alkyloxy group, an alkenyl group, or an alkynyl group; and x ranges from 2 to 1000. The bottom layer is heated at a first temperature to partially crosslink the spin on carbon layer via the first crosslinker. The spin on carbon layer is heated at a second temperature higher than the first temperature to further crosslink the spin on carbon layer via the second crosslinker, and a photoresist layer is formed over the spin on carbon layer. In an embodiment, the method includes selectively exposing the photoresist layer to actinic radiation, developing the selectively exposed photoresist layer to form a photoresist pattern exposing the substrate, and extending the pattern into the substrate. In an embodiment, the method includes removing the photoresist pattern after extending the pattern into the substrate. In an embodiment, the carbon backbone polymer is a polyhydroxystyrene. In an embodiment, the first temperature ranges from 100° C. to 170° C. In an embodiment, the first temperature ranges from 100° C. to 150° C. In an embodiment, the second temperature ranges from 180° C. to 300° C. In an embodiment, the second temperature ranges from 200° C. to 280° C. In an embodiment, R, OR, and NR each include a chain structure, a ring structure, or a 3-D structure. In an embodiment, the 3-D structure is selected from the group consisting of norbornyl, adamantyl, basketanyl, twistanyl, cubanyl, and dodecahedranyl groups.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A spin on carbon composition, comprising:
 a carbon backbone polymer;
 a first crosslinker; and
 a second crosslinker,
 wherein the first crosslinker reacts with the carbon backbone polymer to partially crosslink the carbon backbone polymer at a first temperature, and the second crosslinker reacts with the carbon backbone polymer to further crosslink the carbon backbone polymer at a second temperature higher than the first temperature,
 wherein the first crosslinker is a monomer, oligomer, or polymer,
 wherein the second crosslinker is a monomer, oligomer, or polymer,
 wherein the first and second crosslinkers are different from each other, and
 wherein when either of the first crosslinker or the second crosslinker is a polymer, the polymer is a different polymer than the carbon backbone polymer.

2. The spin on carbon composition of claim 1, wherein the first crosslinker is one or more selected from the group consisting of A-(OR)$_x$, A-(NR)$_x$,

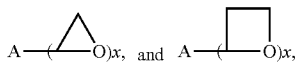

where A is a monomer, oligomer, or a second polymer having a molecular weight ranging from 100 to 20,000;
R is an alkyl group, cycloalkyl group, cycloalkylepoxy group, or C3-C15 heterocyclic group;
OR is an alkyloxy group, cycloalkyloxy group, carbonate group, alkylcarbonate group, alkyl carboxylate group, tosylate group, or mesylate group;
NR is an alkylamide group or an alkylamino group; and
x ranges from 2 to 1000.

3. The spin on carbon composition of claim 2, wherein R, OR, and NR each comprise a chain structure, a ring structure, or a 3-D structure.

4. The spin on carbon composition of claim 2, wherein R is (CH$_2$)$_y$CH$_3$, where 0≤y≤14.

5. The spin on carbon composition of claim 2, wherein OR is (—O(CH$_2$CH$_2$O)$_a$—CH$_2$CH$_3$), where 1≤a≤6.

6. The spin on carbon composition of claim 1, wherein the second crosslinker is one or more selected from the group consisting of A-(OH)$_x$, A-(OR')$_x$, A-(C=C)$_x$, and A-(C≡C)$_x$,
where A is a monomer, oligomer, or a second polymer having a molecular weight ranging from 100 to 20,000;
R' is an alkyloxy group, an alkenyl group, or an alkynyl group; and
x ranges from 2 to 1000.

7. The spin on carbon composition of claim 1, wherein a concentration of the first and second crosslinkers ranges from 20 wt. % to 50 wt. % of a total weight of the first and second crosslinkers and the carbon backbone polymer.

8. The spin on carbon composition of claim 1, wherein the first temperature ranges from 100° C. to 170° C.

9. The spin on carbon composition of claim 8, wherein the 3-D structure is selected from the group consisting of norbornyl, adamantyl, basketanyl, twistanyl, cubanyl, and dodecahedranyl groups.

10. The spin on carbon composition of claim 1, wherein the second temperature ranges from 180° C. to 300° C.

11. The spin on carbon composition of claim 1, wherein the carbon backbone polymer is one selected from the group consisting of a polyhydroxystyrene, a polyacrylate, and a polymethylmethacrylate.

12. The spin on carbon composition of claim 1, wherein a concentration of the first crosslinker is same as a concentration of the second crosslinker.

13. A spin on carbon composition, comprising:
a carbon backbone polymer;
a first crosslinker;
a second crosslinker; and
a solvent,
wherein the first crosslinker reacts with the carbon backbone polymer to partially crosslink the carbon backbone polymer, and the second crosslinker reacts with the carbon backbone polymer to further crosslink the carbon backbone polymer,
wherein the first crosslinker is a polymer,
wherein the second crosslinker is a polymer,
wherein the first and second crosslinkers are different from each other and different from the carbon backbone polymer.

14. The spin on carbon composition of claim 13, wherein the solvent is an organic solvent including one or more of ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, and alkylene glycol monoalkyl esters.

15. The spin on carbon composition of claim 13, wherein a concentration of the first and second crosslinkers ranges from 20 wt. % to 50 wt. % of a total weight of the first and second crosslinkers and the carbon backbone polymer.

16. The spin on carbon composition of claim 13, wherein the carbon backbone polymer is a polyhydroxystyrene.

17. The spin on carbon composition of claim 13, wherein a concentration of the first crosslinker is same as a concentration of the second crosslinker.

18. A spin on carbon composition, comprising:
a carbon backbone polymer;
a first crosslinker;
a second crosslinker; and
a solvent,
wherein the first crosslinker reacts with the carbon backbone polymer to partially crosslink the carbon backbone polymer, and the second crosslinker reacts with the carbon backbone polymer to further crosslink the carbon backbone polymer,
wherein the first crosslinker is a monomer, oligomer, or polymer,
wherein the second crosslinker is a monomer, oligomer, or polymer,
wherein the carbon backbone polymer is one selected from the group consisting of a polyhydroxystyrene, a polyacrylate, and a polymethylmethacrylate,
wherein the first and second crosslinkers are different from each other, and
wherein when either of the first crosslinker or the second crosslinker is a polymer, the polymer is a different polymer than the carbon backbone polymer.

19. The spin on carbon composition of claim 18, wherein a concentration of the first and second crosslinkers ranges from 20 wt. % to 50 wt. % of a total weight of the first and second crosslinkers and the carbon backbone polymer.

20. The spin on carbon composition of claim 18, wherein a concentration of the first crosslinker is same as a concentration of the second crosslinker.

\* \* \* \* \*